(12) United States Patent
Matsumoto et al.

(10) Patent No.: US 8,773,298 B2
(45) Date of Patent: Jul. 8, 2014

(54) INTEGRATED CIRCUIT

(71) Applicant: Renesas Electronics Corporation, Kanagawa (JP)

(72) Inventors: Takashi Matsumoto, Kanagawa (JP); Masao Ito, Kanagawa (JP); Osamu Matsumoto, Kanagawa (JP); Hiroto Suzuki, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/794,308

(22) Filed: Mar. 11, 2013

(65) Prior Publication Data

US 2013/0265180 A1      Oct. 10, 2013

(30) Foreign Application Priority Data

Mar. 13, 2012    (JP) ................................. 2012-055835

(51) Int. Cl.
*H03M 1/34*   (2006.01)
*H03M 1/38*   (2006.01)

(52) U.S. Cl.
CPC ...................................... *H03M 1/38* (2013.01)
USPC .......................................... 341/163; 341/155

(58) Field of Classification Search
CPC ................................... H03M 1/38; H03M 1/46
USPC .................................. 341/155, 163, 144, 141
See application file for complete search history.

(56) References Cited

U.S. PATENT DOCUMENTS

| | | | | |
|---|---|---|---|---|
| 6,809,674 B1 * | 10/2004 | Ramsden | ....................... | 341/155 |
| 7,498,962 B2 * | 3/2009 | Alfano et al. | .................. | 341/122 |
| 7,605,738 B2 * | 10/2009 | Kuramochi et al. | .......... | 341/155 |
| 7,642,945 B2 * | 1/2010 | Tachibana et al. | ............ | 341/163 |
| 7,876,254 B2 * | 1/2011 | Berens et al. | .................. | 341/163 |
| 2009/0295610 A1 | 12/2009 | Yoshimoto | | |
| 2013/0099953 A1 * | 4/2013 | Tsai et al. | ..................... | 341/161 |

FOREIGN PATENT DOCUMENTS

| | | |
|---|---|---|
| JP | 2006-080646 A | 3/2006 |
| JP | 2009-290540 A | 12/2009 |
| JP | 2010-124405 A | 6/2010 |

* cited by examiner

*Primary Examiner* — Peguy Jean Pierre
(74) *Attorney, Agent, or Firm* — McDermott Will & Emery LLP

(57) ABSTRACT

A successive approximation register A/D converter that obtains an output of N bits interrupts operation at a timing when the operation of the successive approximation register A/D converter is affected on the basis of circuit timing in an integrated circuit. The A/D converter performs a comparison between a sampling signal and a comparison reference voltage by a sampling period in which an analog signal is sampled, a comparison period of N states in which the sampled signal is sequentially compared with a comparison voltage for each bit, and a reserve period of M states following the comparison period. When an operation is temporarily interrupted, the A/D converter performs a comparison operation of a bit, whereas the comparison is not performed in the reserve period.

12 Claims, 20 Drawing Sheets

FIG. 2

| COUNT | St (AMOUNT OF TRANSITION) |
|---|---|
| 8 | 256 |
| 7 | 128 |
| 6 | 64 |
| 5 | 32 |
| 4 | 16 |
| 3 | 8 |
| 2 | 4 |
| 1 | 2 |
| 0 | 1 |

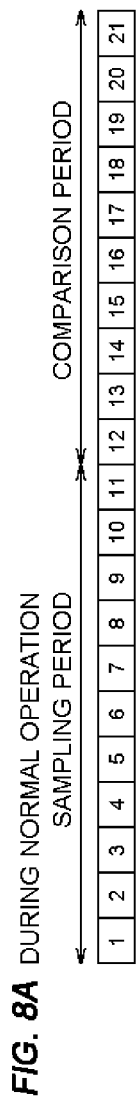
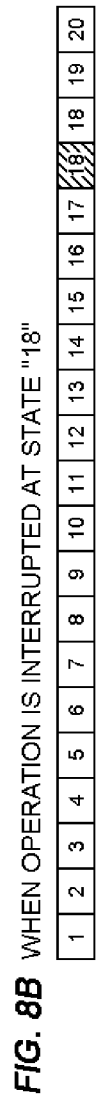
FIG. 8A DURING NORMAL OPERATION
FIG. 8B WHEN OPERATION IS INTERRUPTED AT STATE "18"

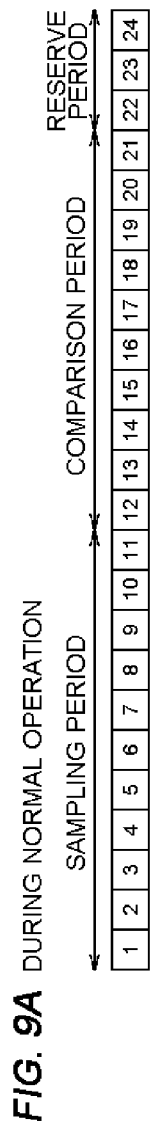
FIG. 9A DURING NORMAL OPERATION
FIG. 9B WHEN OPERATION IS INTERRUPTED AT STATE "18"

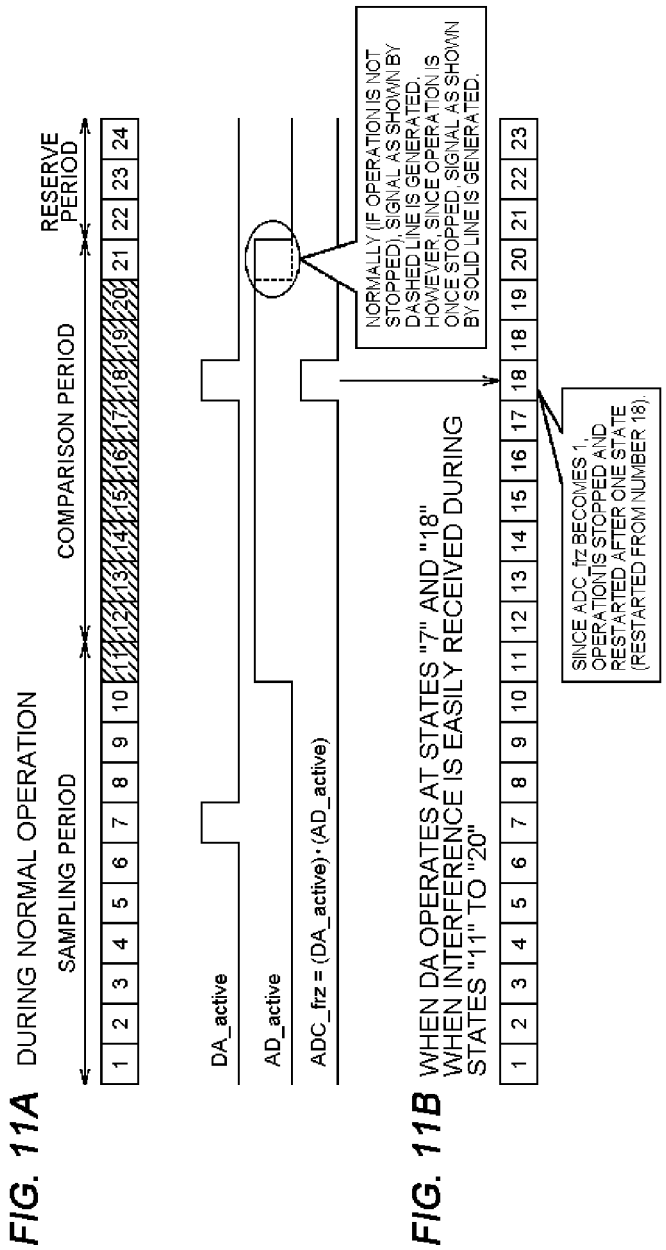

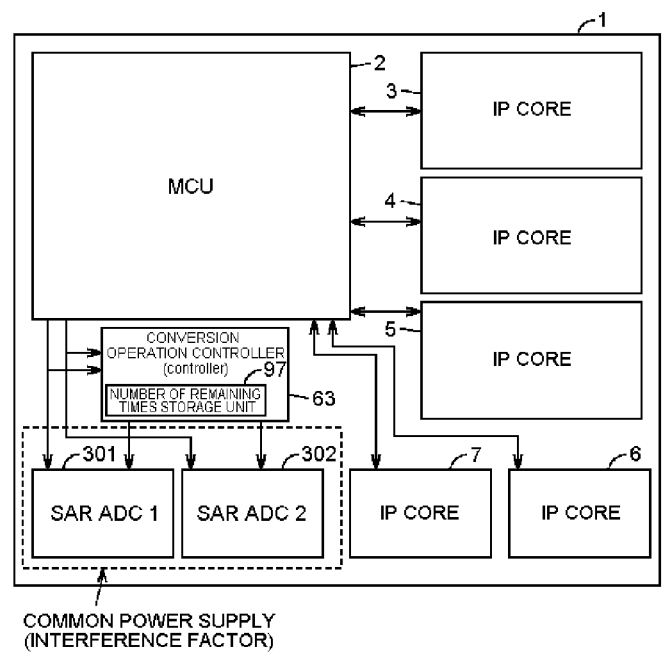

FIG. 14

| AD0_state | AD1_state | STATE(AD0_state) OPERATING CURRENT | STATE(AD0_state) INFLUENCE OF INTERFERENCE | STATE(AD1_state) OPERATING CURRENT | STATE(AD1_state) INFLUENCE OF INTERFERENCE | ADC_frz |
|---|---|---|---|---|---|---|
| 0 | 0 | SMALL | NOT AFFECTED | SMALL | NOT AFFECTED | 0 |
| 0 | 1 | SMALL | NOT AFFECTED | SMALL | AFFECTED | 0 |
| 0 | 2 | SMALL | NOT AFFECTED | LARGE | NOT AFFECTED | 0 |
| 0 | 3 | SMALL | NOT AFFECTED | LARGE | AFFECTED | 0 |
| 1 | 0 | SMALL | AFFECTED | SMALL | NOT AFFECTED | 0 |
| 1 | 1 | SMALL | AFFECTED | SMALL | AFFECTED | 0 |
| 1 | 2 | SMALL | AFFECTED | LARGE | NOT AFFECTED | 1 |
| 1 | 3 | SMALL | AFFECTED | LARGE | AFFECTED | 1 |
| 2 | 0 | LARGE | NOT AFFECTED | SMALL | NOT AFFECTED | 0 |
| 2 | 1 | LARGE | NOT AFFECTED | SMALL | AFFECTED | 1 |
| 2 | 2 | LARGE | NOT AFFECTED | LARGE | NOT AFFECTED | 0 |
| 2 | 3 | LARGE | NOT AFFECTED | LARGE | AFFECTED | 1 |
| 3 | 0 | LARGE | AFFECTED | SMALL | NOT AFFECTED | 0 |
| 3 | 1 | LARGE | AFFECTED | SMALL | AFFECTED | 1 |
| 3 | 2 | LARGE | AFFECTED | LARGE | NOT AFFECTED | 1 |
| 3 | 3 | LARGE | AFFECTED | LARGE | AFFECTED | 1 |

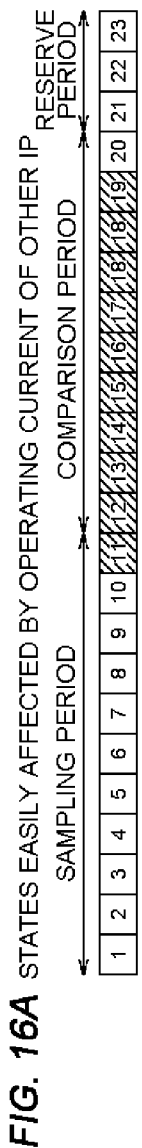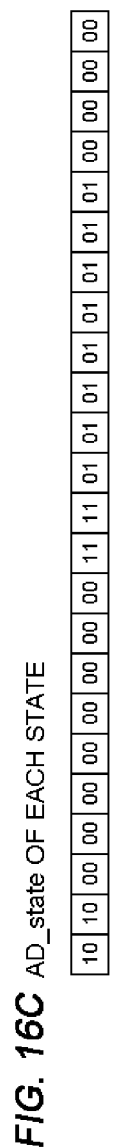
FIG. 16A STATES EASILY AFFECTED BY OPERATING CURRENT OF OTHER IP
FIG. 16B STATES IN WHICH LARGE CURRENT IS GENERATED
FIG. 16C AD_state OF EACH STATE

INTEGRATED CIRCUIT

CROSS-REFERENCE TO RELATED APPLICATION

The disclosure of Japanese Patent Application No. 2012-055835 filed on Mar. 13, 2012 including the specification, drawings and abstract is incorporated herein by reference in its entirety.

BACKGROUND

The present invention relates to an integrated circuit, in particular to an integrated circuit including a successive approximation type analog/digital converter circuit that compares an analog input signal with a plurality of comparison reference voltages and converts the analog input signal into a digital signal on the basis of the comparison result.

Generally, a processing circuit is formed of a digital circuit, and thus an analog signal is converted into a digital signal and then used for processing. For example, an analog signal is inputted into a processor such as a microcomputer from a sensor that detects operation environment, such as a temperature sensor or a speed sensor. The processor converts the analog signal into a digital signal and performs processing in accordance with the operation environment detected by the sensor on the basis of the digital signal.

The conversion from the analog signal to the digital signal is performed by an analog/digital converter circuit (A/D converter circuit). One of the A/D converter circuits is a successive approximation register A/D converter circuit (SAR ADC: Successive Approximation Register Analog Digital Converter).

The successive approximation register A/D converter samples an inputted analog signal and compares the sampled input signal with a comparison reference signal generated by a built-in D/A converter (digital/analog converter) through the use of a comparator. The successive approximation register A/D converter generates the next comparison reference signal in accordance with the comparison result through the use of the built-in D/A converter. The successive approximation register A/D converter converts an analog signal into a digital signal by repetition of the above operation.

A normal successive approximation register A/D converter performs analog/digital conversion through the use of a binary search algorithm. An A/D conversion of N-bit resolution is performed by N steps (N comparisons). The comparator compares an analog input signal Vin with a comparison signal (comparison reference voltage). In the first step, the comparison reference voltage Vref (1) is $2^{\wedge}(N-1)$. In the comparison result, when the analog input signal Vin is larger than the first comparison reference voltage Vref (1), the comparator outputs "1" and the comparison reference voltage Vref (2) in the second step is represented by the following formula:

$$Vref(2)=2^{\wedge}(N-1)+2^{\wedge}(N-2)$$

In contrast, when the analog input signal Vin is lower than the first comparison reference voltage Vref (1), the comparator outputs "−1" (0) and the comparison reference voltage Vref (2) is represented by the following formula:

$$Vref(2)=2^{\wedge}(N-1)-2^{\wedge}(N-2)$$

That is, in the binary search algorithm, the next comparison reference voltage is obtained by adding or subtracting ½ of the comparison reference voltage of the previous cycle in accordance with the comparison result.

As shown in Japanese Patent Laid-Open No. 2010-124405 (Patent Document 1), an operation sequence of the successive approximation register A/D converter is divided into (1) a sampling period in which an input analog signal is sampled by a sample hold circuit and (2) a comparison period in which an N-bit digital signal is obtained by a comparator and the like. For example, 10-bit A/D conversion is performed by assigning 11 states to the sampling period and 10 states to the comparison period.

SUMMARY

In recent years, to respond to a request to further reduce the size of a circuit, a plurality of circuits has been sharing a power supply. However, since the power supply is shared, an operating current is generated by an operation of a certain circuit, and the operating current may have adverse effects such as interference on other circuits via a power supply line.

Various countermeasures against the adverse effects are devised. For example, there are physical countermeasures such as preparing a separate power supply for each circuit or lowering impedance of the power supply line. However, such physical countermeasures cause increase of the number of pins and increase of the chip size because other pins are prepared, wiring is thickened, or a capacitance is inserted between the power supply and the ground. As a result, the cost increases.

Japanese Patent Laid-Open No. 2009-290540 (Patent Document 2) reduces adverse effects of power supply noise due to operation of a sample and hold circuit, by performing control so that the sample and hold circuit and a comparator in an analog circuit do not operate at the same time. However, only interference between the sample and hold circuit and the comparator is aimed at and interference between the sample and hold circuit and the other circuits (D/A converter and the like) is not solved.

In addition, a technique for avoiding interference by limiting an operation of one circuit while the other circuit is operating is disclosed. For example, in Japanese Patent Laid-Open No. 2006-80646 (Patent Document 3), a digital circuit and an analog circuit are controlled not to operate at the same time, and thus influence of interference and the like based on the operation of the digital circuit are reduced. However, the A/D conversion is temporarily interrupted, and thus output of the conversion result is delayed by the period in which the operation is interrupted. For example, since the comparison is not completed, the comparison result is discarded or the comparison result is not outputted until the next comparison period.

As described above, the techniques described in the above Patent Documents still have problems in reducing the influence of interference through the power supply, and the output of the result of A/D conversion may be delayed. Other problems and new features will be clear from the description of the present specification and the attached drawings.

According to an embodiment, a successive approximation register A/D converter that obtains an output of N bits interrupts operation at a timing when the operation of the successive approximation register A/D converter is affected on the basis of operation timings of circuits in an integrated circuit. The successive approximation register A/D converter performs a comparison between a sampling signal and a comparison reference voltage by a sampling period in which an analog signal is sampled, a comparison period of N states in which the sampled signal is sequentially compared with a comparison voltage for each bit, and a reserve period of M states following the comparison period. When an operation is temporarily interrupted, the successive approximation register A/D converter performs a comparison operation of a bit, where the comparison is not performed in the comparison period, in the reserve period.

According to an embodiment, in a successive approximation register A/D converter, it is possible to reduce influence of interference through a power supply and prevent delay of output of A/D conversion.

BRIEF DESCRIPTION OF THE DRAWINGS

FIG. 2 is a diagram showing a transition code St;

FIGS. 8A and 8B are diagrams showing periods of a comparison operation according to a related art;

FIGS. 9A and 9B are diagrams showing periods of a comparison operation according to the first embodiment;

FIGS. 11A and 11B are diagrams showing an operation example according to the second embodiment;

FIG. 12 is a diagram showing a configuration of an integrated circuit according to a third embodiment;

FIG. 13 is a diagram showing a signal AD_state;

FIG. 14 is a diagram showing outputs of an operation interruption signal according to operation states of successive approximation register A/D converters;

FIGS. 16A, 16B, and 16C are diagrams showing states in which influence of operating current is large and states in which operation is easily affected by interference in an operation state of a successive approximation register A/D converter;

DETAILED DESCRIPTION

Hereinafter, each embodiment will be described with reference to the drawings.

<Comparison with Related Art>

First, a technique of a related successive approximation register A/D converter will be described in order to compare with descriptions of successive approximation register A/D (analog/digital) converters (SAR ADC) of each embodiment.

<Configuration of Related Art>

Figure 1:
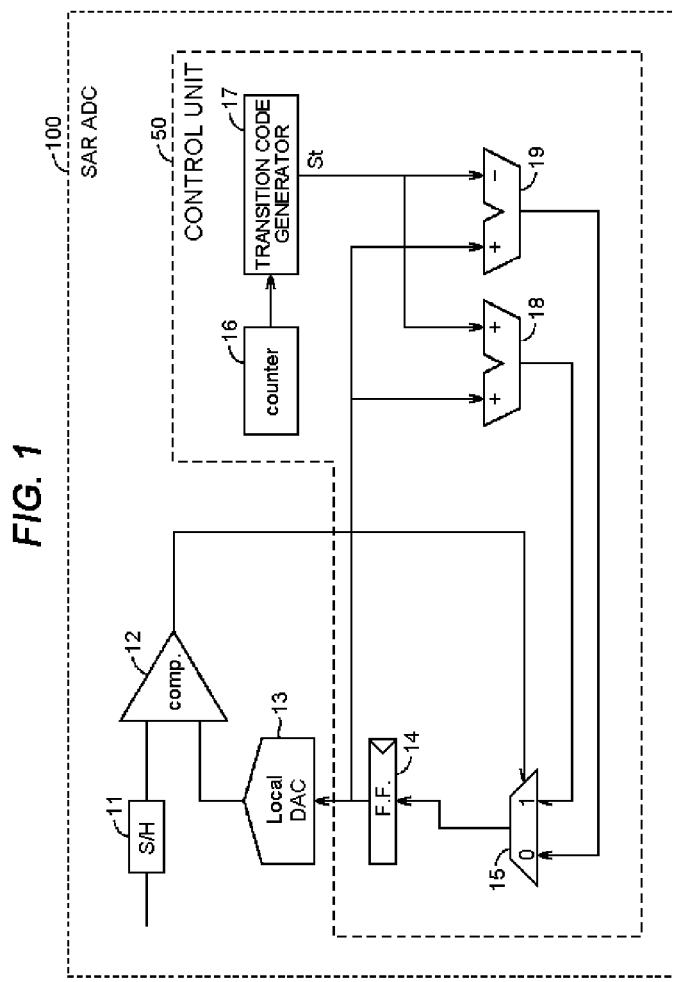
FIG. 1 is a diagram showing a configuration of a successive approximation register A/D converter 100.

FIG. 1 is a diagram showing a configuration of a successive approximation register A/D converter 100.

The successive approximation register A/D converter 100 outputs an inputted analog input voltage as a digital value by a binary search algorithm. The successive approximation register A/D converter 100 includes a sample/hold circuit 11, a comparator 12, a Local DAC 13, and a control unit 50.

The sample/hold circuit 11 samples an analog voltage inputted into the successive approximation register A/D converter 100 and holds the analog voltage during an A/D conversion operation of the successive approximation register A/D converter 100.

The comparator 12 receives an output of the sample/hold circuit 11 and an output of the Local DAC 13 described later, compares the magnitudes of the outputs, and outputs a comparison result. The comparator 12 sequentially outputs the comparison results, and thus an A/D conversion of N bits is performed.

The Local DAC 13 is a D/A (digital/analog) converter included in the successive approximation register A/D converter 100 and outputs an analog voltage according to a comparison code. The comparison code indicates a magnitude of an analog voltage for performing a comparison with an output of the sample/hold circuit 11 in the comparator 12. The comparison code is outputted from the control unit 50.

The control unit 50 determines the comparison code and outputs the comparison code to the Local DAC 13 in order to control the magnitude of the analog voltage outputted from the Local DAC 13. Specifically, the control unit 50 includes a counter 16, a transition code generator 17, an adder 18, a subtracter 19, a selector 15, and an FF (flip-flop) 14 and determines the comparison code in accordance with the output result of the comparator 12.

The counter 16 outputs a count value to the transition code generator 17. The counter 16 counts down for each state during a comparison period in which the output of the sample/hold circuit 11 and the output of the Local DAC 13 are sequentially compared in the successive approximation register A/D converter 100. The comparison period will be described later.

The transition code generator 17 outputs a transition code St to the adder 18 and the subtracter 19 according to the output result of the counter 16. The transition code St indicates an amount by which the output voltage of the Local DAC 13 is changed.

FIG. 2 is a diagram showing the transition code St. As shown in FIG. 2, the transition code St is associated with a count value of the counter 16. In the example shown in FIG. 2, the counter 16 counts down from a count value "8" and the transition code generator 17 outputs the transition code St in accordance with the count value of the counter 16.

The adder 18 and the subtracter 19 calculate in advance a candidate of a comparison code to be next outputted on the basis of a comparison code being outputted from the Local DAC 13.

The adder 18 adds a comparison code held by the FF 14 described later and the transition code St together and outputs the addition result to the selector 15.

The subtracter 19 subtracts the transition code St from the comparison code held by the FF 14 and outputs the subtraction result to the selector 15.

The selector 15 selects a comparison code used as a bit position to be next compared by the successive approximation register A/D converter 100 in accordance with the comparison result of the comparator 12. The selector 15 receives the outputs of the adder 18 and the subtracter 19 and the comparison result of the comparator 12 and outputs either the output of the adder 18 or the output of the subtracter 19 to the FF 14.

For example, it is assumed that the comparator 12 outputs a comparison result indicating that the analog voltage held by the sample/hold circuit 11 is larger than the output of the Local DAC 13 (a case where the comparator 12 outputs "1" in FIG. 1). In this case, the selector 15 selects a value (an output of the adder 18) obtained by adding the transition code St to the comparison code and outputs the selected value to the FF 14.

In addition, it is assumed that the comparator 12 outputs a comparison result indicating that the output of the Local DAC 13 is smaller than the analog voltage (a case where the comparator 12 outputs "0" in FIG. 1). In this case, the selector 15 selects a value (an output of the subtracter 19) obtained by subtracting the transition code St from the comparison code and outputs the selected value to the FF 14.

The FF 14 holds the comparison code, which is the output result of the selector 15, and outputs the comparison code to the Local DAC 13.

<Operation of Related Art>

An operation of the successive approximation register A/D converter 100 having the above configuration will be described.

The operation of the successive approximation register A/D converter 100 mainly includes a sampling period and a comparison period.

Figure 3:
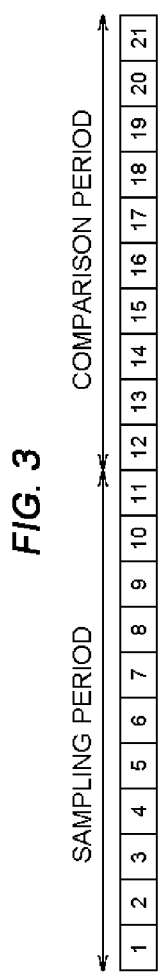
FIG. 3 is a diagram showing operation periods of the successive approximation register A/D converter 100.

FIG. 3 is a diagram showing an operation period of the successive approximation register A/D converter 100. The sampling period is a period in which an analog input voltage to be A/D converted is received and an analog signal is sampled by the sample/hold circuit 11.

The comparison period is a period in which, by operations of the comparator 12, the Local DAC 13, the control unit 50, and the like, the output of the Local DAC 13 is sequentially changed, comparison is performed by the comparator 12, and A/D conversion is performed.

Comparison is performed N times by the comparator 12, and thus a comparison result (A/D conversion result) of N bits is obtained.

For example, as shown in FIG. 3, 11 states are prepared as the sampling period and 10 states are prepared as the comparison period, and thus an A/D conversion result of 10 bits is obtained by the successive approximation register A/D converter.

Figure 4:
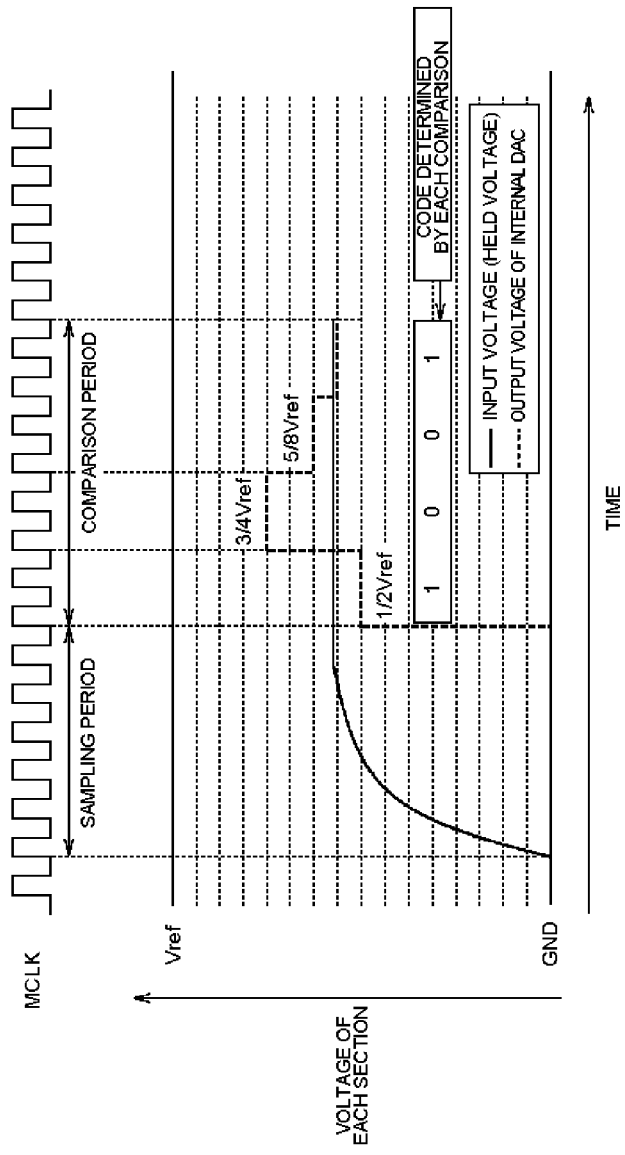
FIG. 4 is a diagram showing details of an operation of the successive approximation register A/D converter.

The operation of the successive approximation register A/D converter will be specifically described. FIG. 4 is a diagram showing details of the operation of the successive approximation register A/D converter.

FIG. 4 shows a successive approximation register A/D converter which performs 4-bit A/D conversion. As shown in FIG. 4, the successive approximation register, A/D converter, which obtains an output of 4 bits, operates in synchronization with a clock MCLK in the sampling period and an analog input voltage is sampled by the sample/hold circuit 11. The sample/hold circuit 11 holds a voltage at the time when the sampling is completed, during the comparison period. As shown in the example in FIG. 4, a comparison operation is performed using a predetermined number of clocks MCLK as one state.

The voltage held by the sample/hold circuit 11 is compared with a voltage generated by the Local DAC 13. A voltage first outputted by the Local DAC 13 in the comparison period is defined as ($\frac{1}{2}$ Vref). When the voltage held by the sample/hold circuit 11 is larger than the voltage of the Local DAC 13, the comparison result is set to "1". Furthermore, when the voltage held by the sample/hold circuit 11 is smaller than the voltage of the Local DAC 13, the comparison result is set to "0". After the first comparison, the voltage outputted from the Local DAC 13 is changed to ($\frac{1}{4}$ Vref) by the binary search algorithm. After the second comparison, similarly, the voltage is changed to ($\frac{1}{8}$ Vref). Thereafter, the comparisons are performed in the same manner.

When the voltage is changed in this way, in the comparison period, the comparison results are outputted in order from the most significant bit. In the example of FIG. 4, in the first comparison, the voltage of the sample/hold circuit 11 is larger than the voltage of the Local DAC 13, and thus the output of the comparator 12 is "1".

In the second comparison, the output of the Local DAC 1 is set to ($\frac{3}{4}$ Vref) which is obtained by adding ($\frac{1}{4}$ Vref) to ($\frac{1}{2}$ Vref).

In the second comparison, the output of the Local DAC 13 is larger than the voltage of the sample/hold circuit 11, and thus the comparator 12 outputs "0". Therefore, the control unit 50 determines the comparison code so that the comparison is performed by a voltage obtained by subtracting ($\frac{1}{8}$ Vref) from ($\frac{3}{4}$ Vref) in the third comparison.

In the third comparison, the output of the Local DAC 13 is set to ($\frac{5}{8}$ Vref) which is obtained by subtracting ($\frac{1}{8}$ Vref) from ($\frac{3}{4}$ Vref). Also in the third comparison, the output of the Local DAC 13 is larger than the voltage of the sample/hold circuit 11, and thus the comparator 12 outputs "0". Therefore, in the fourth comparison, the control unit 50 performs control so that the output of the Local DAC 13 is set to ($\frac{9}{16}$ Vref) which is obtained by subtracting ($\frac{1}{16}$ Vref) from ($\frac{5}{8}$ Vref).

In the fourth comparison, the output of the Local DAC 13 is set to ($\frac{9}{16}$ Vref) and the output of the Local DAC 13 is compared with the output of the sample/hold circuit 11 by the comparator 12. In the fourth comparison, the output of the sample/hold circuit 11 is larger than the output of the Local DAC 13, and thus the comparator 12 outputs "1".

In this way, in the comparison period, the successive approximation register A/D converter 100 compares the output of the Local DAC 13 with the output of the sample/hold circuit 11 by sequentially changing the output of the Local DAC 13 for each bit. Thereby, the successive approximation register A/D converter 100 obtains a 4-bit comparison result "1001".

<Integrated Circuit Including Related Art>

The successive approximation register A/D converter, which is described as related art, is mounted on an integrated circuit and exerts functions thereof.

As integrated circuits are required to improve functions such as reduction of the size thereof, a plurality of circuits increasingly shares a common power supply.

Figure 5:
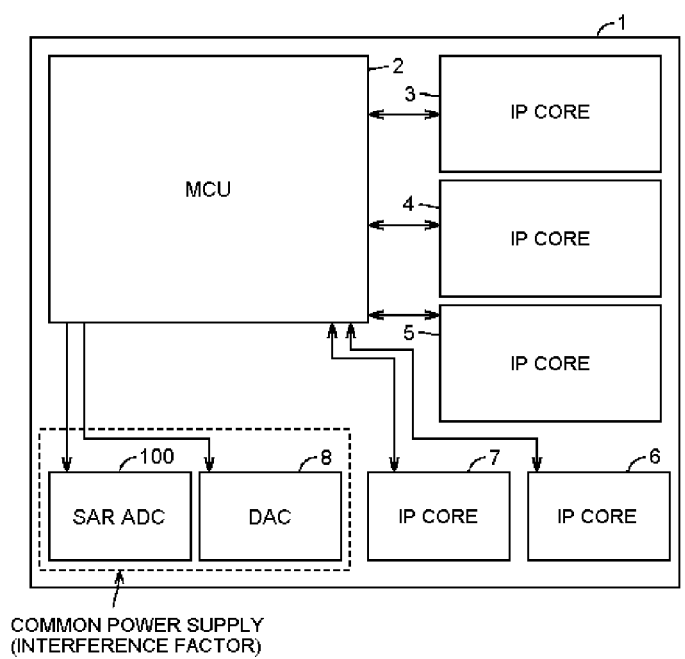
FIG. 5 is a diagram showing an example of an integrated circuit on which the successive approximation register A/D converter is mounted.

FIG. 5 is a diagram showing an example of an integrated circuit on which the successive approximation register A/D converter is mounted. As shown in FIG. 5, the integrated circuit 1 includes a plurality of IP cores (intellectual property cores) (IP cores 3, 4, 5, 6, and 7) and an MCU (Micro Control Unit) 2. The MCU 2 integrally controls operations of the IP cores by outputting, to each IP core, an operation control signal for controlling an operation of each IP core.

In FIG. 5, the successive approximation register A/D converter 100 and the DAC (digital to analog converter) 8 share a common power supply. An operating current of the DAC 8 interferes with the successive approximation register A/D converter 100 through a power supply line and affects the operation of the successive approximation register A/D converter 100.

<1 First Embodiment>

Next, an embodiment of a successive approximation register A/D converter and an integrated circuit which cope with the problems of the related art (the problems of interference caused by sharing a power supply line by each IP core) will be described. In the first embodiment, the DAC 8 will be described as an example of another circuit that interferes with an operation of a successive approximation register A/D converter 200.

Figure 6:
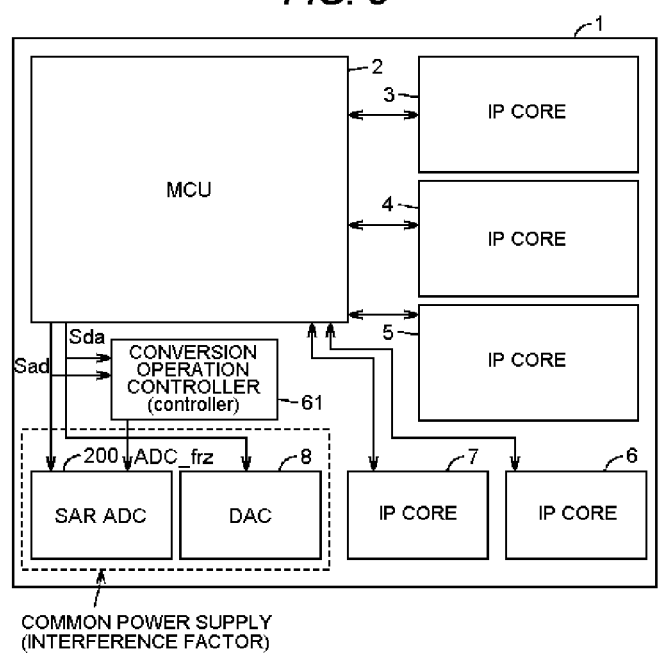
FIG. 6 is a diagram showing a configuration of an integrated circuit 1 according to a first embodiment.

FIG. 6 is a diagram showing a configuration of the integrated circuit 1 according to the first embodiment. Also in the example of FIG. 5, it is assumed that the successive approximation register A/D converter 200 and the DAC 8 share a common power supply. Therefore, the operating current of the DAC 8 affects the operation of the successive approximation register A/D converter 200.

As compared with the related art described above, the difference is the fact that the integrated circuit 1 includes a conversion operation controller 61 and the successive approximation register A/D converter 200. Hereinafter, the difference will be specifically described.

<1.1 Configuration of First Embodiment>

In the first embodiment, the above problems are coped with by interrupting the operation of the successive approximation register A/D converter 200 in the operation timing of the DAC 8.

As shown in FIG. 6, the conversion operation controller 61 determines the interruption timing of the comparison operation of each bit of the successive approximation register A/D converter 200 on the basis of the operation timing of a circuit that interferes with the operation of the successive approximation register A/D converter 200.

Specifically, the MCU 2 outputs an operation control signal (Sad) to the successive approximation register A/D converter 200 and outputs an operation control signal (Sda) to the DAC 8. The conversion operation controller 61 acquires the operation control signal (Sda) that is outputted to the DAC 8 by the MCU 2. A timing when the operating current of the DAC 8 affects the operation of the successive approximation register A/D converter 200 is stored in the conversion operation controller 61 in advance. The conversion operation controller 61 determines the timing when the DAC 8 interferes with the operation of the successive approximation register A/D converter 200 from the timing of acquiring the operation control signal (Sda), turns on an operation interruption signal (ADC_frz) at the determined timing, and outputs the operation interruption signal (ADC_frz) to the successive approximation register A/D converter 200.

For example, the conversion operation controller 61 may determine a specific period of time from when the MCU 2 outputs the operation control signal to the DAC 8 (activates the DAC 8) as an interruption timing of the comparison operation of the successive approximation register A/D converter 200 and generate an operation interruption signal that is activated in the specific period of time. The specific period of time in which the comparison operation is interrupted may be held by a register or the like and be varied.

Figure 7:
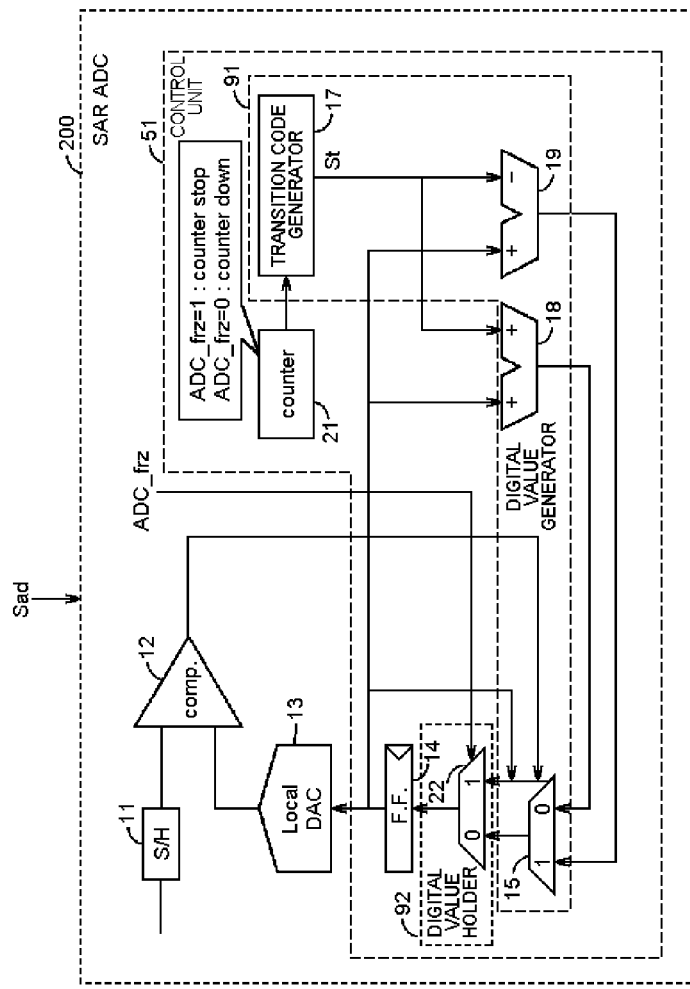
FIG. 7 is a diagram showing a configuration of a successive approximation register A/D converter 200.

FIG. 7 is a diagram showing a configuration of the successive approximation register A/D converter 200. The successive approximation register A/D converter 200 operates on the basis of the operation control signal (Sda). As compared with the related art, a selector 22 is included in a configuration of the control unit 51. Further, a counter 21 is included instead of the counter 16. In FIG. 7, the operation interruption signal (ADC_frz) is outputted from the conversion operation controller 61. The successive approximation register A/D converter 200 interrupts the comparison operation of each bit of the comparator 12 (when the comparison operation is interrupted, the operation does not proceed to the comparison operation of the next bit) in accordance with the operation interruption signal (ADC_frz). In the example of FIG. 7, the successive approximation register A/D converter 200 interrupts the comparison operation of the comparator 12 when the operation interruption signal (ADC_frz) is "1 (on)" and performs the comparison operation when the operation interruption signal (ADC_frz) is "0 (off)".

The successive approximation register A/D converter 200 includes the transition code generator 17, the adder 18, the subtracter 19, and the selector 15, and thus a digital value generator 91 is constituted. The digital value generator 91 generates a digital value indicating a magnitude of the output voltage of the Local DAC 13 in the comparison operation at the next bit position in accordance with the count value of the counter 21, that is, the bit position at which the comparison operation is performed by the comparator 12.

The digital value holder 92 includes the selector 22, and thus the digital value holder 92 receives a digital value indicating a magnitude of an analog voltage outputted from the Local DAC 13 in accordance with the bit position at which the comparison operation is performed by the comparator 12 and the digital value generated by the digital value generator 91 and outputs any one of the above digital values to the FF 14.

The selector 22 switches a comparison code outputted to the Local DAC 13 depending on whether or not the comparison operation of the successive approximation register A/D converter 200 is interrupted. As shown in FIG. 7, the selector 22 receives a comparison code of the Local DAC 13 which is held by the FF 14, a comparison code of the next state which is outputted from the selector 15, and the operation interruption signal (ADC_frz). When the operation interruption signal (ADC_frz) is on ("1" in the example shown in FIG. 7), the selector 22 continuously outputs the comparison code held by the FF 14 and interrupts updating the comparison code of the Local DAC 13.

The counter 21 controls countdown of the counter value in accordance with the operation interruption signal. As shown in FIG. 7, when interrupting the comparison operation of the successive approximation register A/D converter 200, the counter 21 stops the countdown. When performing the comparison operation of the successive approximation register A/D converter 200, the counter 21 starts the countdown.

In this way, the successive approximation register A/D converter 200 interrupts the comparison operation by the operation interruption signal (ADC_frz).

<1.2 Operation of First Embodiment>

The successive approximation register A/D converter 200 has a reserve period of M states (M is an integer greater than or equal to 1) in addition to the sampling period and the comparison period in order to perform A/D conversion. Regarding the bits where the comparison is not performed in the comparison period, the comparison operation is performed in the reserve period. In the description of the present embodiment, the successive approximation register A/D converter 200 has three states in the reserve period.

A case where the comparison operation is interrupted will be compared between the comparison operation of the related art and the comparison operation of the embodiment.

FIGS. 8A and 8B are diagrams showing periods of the comparison operation in the related art. As shown in FIG. 8A, when the comparison operation is not interrupted, in the example shown in FIG. 8A, the analog signal is sampled by the sample/hold circuit 11 in the sampling period including 11 states and 10-bit A/D conversion is performed in the comparison period including 10 states (states 12 to 21).

However, as shown in FIG. 8B, when the comparison operation is temporarily interrupted in the comparison operation (for example, the comparison operation is interrupted in state 18), the comparison of the state in which the comparison operation is interrupted is performed in the next state. Therefore, the comparison operation of 9 states is performed in the comparison period. The comparison operation of the 10th bit is not completed. Therefore, the comparison result is discarded, or the comparison of the 10th bit is performed when the successive approximation register A/D converter operates next time.

FIGS. 9A and 9B are diagrams showing periods of the comparison operation according to the first embodiment. As shown in FIG. 9B, when the comparison operation is temporarily interrupted (for example, the comparison operation is interrupted in state 18), the comparison of 9 states is performed in the comparison period. Since the comparison operation is temporarily interrupted, the comparison of the 10th bit is not performed in the comparison period. However, since the present embodiment has the reserve period, the comparison of the 10th bit is performed in the reserve period.

In this way, when the operation interruption signal is inputted into the successive approximation register A/D converter 200, the successive approximation register A/D converter 200 interrupts the comparison operation. In the comparison operation, the reserve period is provided. Therefore, even when the comparison operation is temporarily interrupted, the successive approximation register A/D converter 200 can complete the comparison corresponding to the number of bits outputted from the successive approximation register A/D converter 200.

According to the configuration of the first embodiment described above, the comparison operation of the successive approximation register A/D converter 200 is interrupted according to the operation timing of another circuit (DAC 8) that interferes with the operation of the successive approximation register A/D converter 200. Therefore, the influence of the interference can be avoided.

Moreover, in the configuration of the successive approximation register A/D converter of the related art, when the comparison operation is temporarily interrupted, the conversion from analog to digital is not performed for all the bits and the comparison result maybe be discarded, and thus the conversion is not necessarily completed. In contrast, the successive approximation register A/D converter 200 includes the reserve period in the comparison operation. Even when the comparison operation is temporarily interrupted, the comparison is performed in the reserve period, and thus it is possible to stabilize the conversion time from when the analog signal is inputted to when the analog signal is converted into a digital signal.

Power supply voltage fluctuation that occurs when the DAC operates attenuates after a certain time and reaches a steady state. Therefore, in the configuration of the first embodiment, it is possible to interrupt the operation of the successive approximation register A/D converter 200 while the power supply voltage fluctuates and restart the operation after the power supply voltage fluctuation caused by the DAC attenuates to some extent. Thereby, the influence of the interference can be reduced.

<2 Second Embodiment>

Next, a successive approximation register A/D converter and an integrated circuit according to another embodiment will be described.

<2.1 Configuration of Second Embodiment>

Figure 10B:
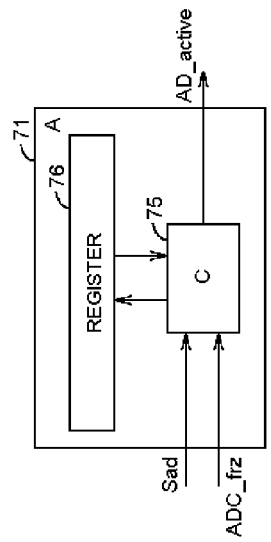
FIGS. 10A and 10B are diagrams showing a configuration of an integrated circuit according to a second embodiment.
Figure 10A:
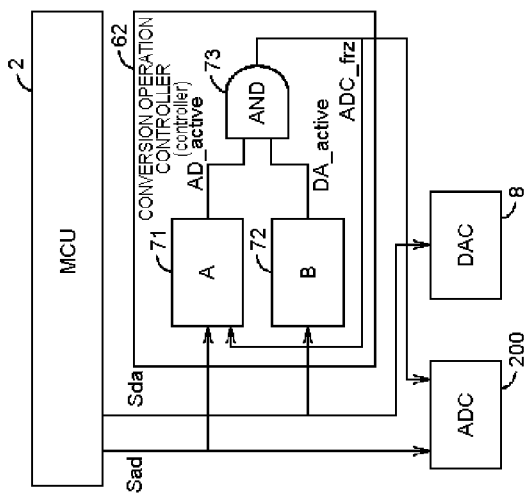

FIGS. 10A and 10B are diagrams showing a configuration of an integrated circuit according to a second embodiment.

FIGS. 10A and 10B show a partial configuration of the integrated circuit, which includes a conversion operation controller 62 in comparison with the configuration of the first embodiment.

In the second embodiment, the conversion operation controller 62 outputs an operation interruption signal depending on whether or not a state where the comparison operation is performed by the successive approximation register A/D converter 200 is a state that is difficult to be interfered in addition to a timing when the DAC 8 interferes with the operation of the successive approximation register A/D converter 200 as in the first embodiment.

As shown in FIG. 10A, the conversion operation controller 62 includes a logic circuit A 71, a logic circuit B 72, and an AND circuit 73. In addition, FIG. 10B shows a more specific configuration of the logic circuit A 71, and the logic circuit A 71 includes a logic circuit C 75 and a register 76.

The conversion operation controller 62 acquires the operation control signal (Sad) outputted from the MCU 2 to the successive approximation register A/D converter 200 and the operation control signal (Sda) outputted from the MCU 2 to the DAC 8.

The logic circuit A 71 outputs a signal (AD_active) indicating whether or not the successive approximation register A/D converter 200 is in a state of being easily affected by the interference to the AND circuit 73 on the basis of the acquired operation control signal (Sad). The signal AD_active is turned on at a timing when the successive approximation register A/D converter 200 is easily affected by the interference. For example, if the acquired operation control signal (Sad) includes an operation start signal of the successive approximation register A/D converter 200, the number of states used for sampling, and the transition code St at the time of the conversion operation, the signal AD_active is generated from the above. Alternatively, the number of states used for the sampling of the successive approximation register A/D converter 200 may be fixed and written to the register 76 of the logic circuit A 71.

Specifically, as shown in FIG. 10B, the logic circuit A 71 includes a logic circuit C 75 and a register 76. The logic circuit C 75 receives an input of the operation control signal (Sad) and turns on the signal AD_active at a timing when the successive approximation register A/D converter 200 is easily affected by the interference (for example, the latter half of the sampling period and the comparison period). The timing when the successive approximation register A/D converter 200 is easily affected by the interference may be stored in the register 76 and be variable. Furthermore, the logic circuit C 75 receives the operation interruption signal (ADC_frz) and controls the output of the signal AD_active. Since the comparison operation of the successive approximation register A/D converter 200 is interrupted by the operation interruption signal (ADC_frz), the comparison operation of the successive approximation register A/D converter 200 after the interruption is performed in states that are shifted by the number of states in which the comparison operation is interrupted. Therefore, the logic circuit C 75 receives the operation interruption signal (ADC_frz), and outputs the signal AD_active after the interruption by controlling the signal AD_active so as to be shifted by the number of states in which the comparison operation is interrupted so that the comparison operation of the successive approximation register A/D converter 200 and the signal AD_active correspond to each other.

In the same manner as the conversion operation controller 61 of the first embodiment, the logic circuit B 72 turns on the signal (DA_active) at the timing when the DAC 8 interferes with the operation of the successive approximation register A/D converter 200 on the basis of the acquired operation control signal (Sda), and outputs the signal (DA_active) to the AND circuit 73. For example, the acquired operation control signal (Sda) includes a start signal of the DAC 8 and an input code for causing the DAC 8 to output an analog signal. When there is a change of input code that causes the DAC 8 to generate a large operating current, the logic circuit B 72 turns on the signal DA_active.

Note that, the "change of input code that generates a large operating current" is determined in advance by a simulation or the like and the signal DA_active may be turned on only when such a change occurs. Furthermore, the extent of the "change of input code which generates a large operating current" which causes the logic circuit B 72 to turn on the signal DA_active may be set in a register or the like.

The AND circuit 73 outputs the operation interruption signal (ADC_frz) to the successive approximation register A/D converter 200 at the timing when the successive approximation register A/D converter 200 is easily affected by the interference and at the timing when the DAC 8 interferes with the operation of the successive approximation register A/D converter 200. As shown in FIG. 10A, the AND circuit 73 receives the signal AD_active and the signal DA_active and outputs the operation interruption signal (ADC_frz).

<2.2 Operation of Second Embodiment>

The operation of the AND circuit 73 and the comparison operation of the successive approximation register A/D converter 200 according to the second embodiment configured as described above will be described.

FIGS. 11A and 11B are diagrams showing an operation example according to the second embodiment. FIG. 11A shows a state in which the successive approximation register A/D converter 200 is easily affected by the interference. Whether or not the successive approximation register A/D converter 200 is in a state of being easily affected by the interference is checked in advance at the time of design and this information is included in the integrated circuit or whether or not the A/D converter is in a state of being easily affected by the interference is checked after the design and this information can be set in the register 76.

The state in which the successive approximation register A/D converter 200 is easily affected is, for example, the latter half of the sampling period, and the comparison period. In FIGS. 11A and 11B, the states 11 to 20 are the states in which the successive approximation register A/D converter 200 is easily affected by the interference. For example, the state 11 is the end of the sampling period. If interference is applied in this state, the interference largely affects the result of the sampling. Moreover, if the successive approximation register A/D converter 200 is affected by the interference in the comparison period, the interference may affect the output of the digital value, which is the comparison result.

As shown in FIG. 11A, when both the signal AD_active and the signal DA_active are on, the operation interruption signal (ADC_frz) is outputted from the conversion operation controller 62.

FIG. 11B shows an operation example in the case where the DAC 8 performs an operation which causes interference in states 7 and 18 and the operation of the successive approximation register A/D converter 200 is easily affected by the interference in states 11 to 20.

The operation interruption signal (ADC_frz) is on in state 18. Therefore, the successive approximation register A/D converter 200 interrupts the operation and restarts the comparison operation of the state 18 after one state. Note that, if the comparison operation is not interrupted, the signal AD_active is represented by the dotted line in FIG. 11A, but since the operation is interrupted in one state, the signal AD_active is outputted as shown by the solid line.

According to the second embodiment described above, it is possible to control the interruption of the comparison operation of the successive approximation register A/D converter depending on whether or not the operation timing is a timing when the successive approximation register A/D converter is easily affected by the interference.

<3 Third Embodiment>

Next, a successive approximation register A/D converter and an integrated circuit according to another embodiment will be described.

<3.1 Configuration of Third Embodiment>

FIG. 12 is a diagram showing a configuration of an integrated circuit according to a third embodiment.

In comparison with the configurations of the first and the second embodiments, the integrated circuit includes a conversion operation controller 63 and two successive approximation register A/D converters (successive approximation register A/D converter 301 and successive approximation register A/D converter 302).

Since a successive approximation register A/D converter also generates an operating current at the time of the operation, it may affect other IP cores. Therefore, in the third embodiment, a configuration is shown in which a successive approximation register A/D converter affects other IP cores. For example, a configuration is shown in the case where two successive approximation register A/D converters (the successive approximation register A/D converter 301 and the successive approximation register A/D converter 302) share a power supply.

The conversion operation controller 63 acquires operation control signals to the successive approximation register A/D converters. The conversion operation controller 63 outputs operation interruption signals to the successive approximation register A/D converters on the basis of a timing when the successive approximation register A/D converters affect the other IP cores, in addition to a timing when the successive approximation register A/D converters are affected by the interference as in the embodiments described above.

Since there are two successive approximation register A/D converters (the successive approximation register A/D converter 301 and the successive approximation register A/D converter 302), both successive approximation register A/D converters generate an operating current and both successive approximation register A/D converters are affected by the operating current of any one of the successive approximation register A/D converters. Therefore, the conversion operation controller 63 generates a signal AD_state indicating a state of a successive approximation register A/D converter for each successive approximation register A/D converter. The signal AD_state indicates whether or not the operation of a successive approximation register A/D converter largely affects the other IP cores (whether or not a large operating current is generated) and whether or not the operation state of a successive approximation register A/D converter is easily affected by the interference.

Furthermore, the conversion operation controller 63 stores the remaining number of states in which the comparison operation can be performed using the reserve period in each successive approximation register A/D converter (remaining number of times storage unit 97) and generates a signal AD_wait indicating the remaining number of times. It is assumed that the number of states of the reserve period is determined in advance, and the signal AD_wait is subtracted by the number of times of the operation interruption signal having been outputted from the conversion operation controller 63 to each successive approximation register A/D converter. Thereby, when the conversion operation controller 63 interrupts the comparison operation of anyone of the successive approximation register A/D converters, the conversion operation controller 63 can determine which one is to be interrupted in accordance with the remaining period of the reserve period in each successive approximation register A/D converter.

FIG. 13 is a diagram showing the signal AD_state. As shown in FIG. 13, the state of the successive approximation register A/D converter is classified into four types.

FIG. 14 is a diagram showing the outputs of the operation interruption signal in accordance with the operation states of the successive approximation register A/D converters.

In FIG. 14, regarding the operation states of the two successive approximation register A/D converters, the operation state of a first successive approximation register A/D converter (SAR ADC 1) is represented by a signal AD0_state and the operation state of a second successive approximation register A/D converter (SAR ADC 2) is represented by a signal AD1_state.

As shown in FIG. 14, at a timing when the operation state of any one successive approximation register A/D converter is affected by the interference, if the operation state of the other successive approximation register A/D converter largely affects other IP cores, the operation interruption signal is turned on.

The conversion operation controller 63 generates the signal AD_state for each successive approximation register A/D converter, by the acquired operation control signal of each successive approximation register A/D converter.

Figure 15:
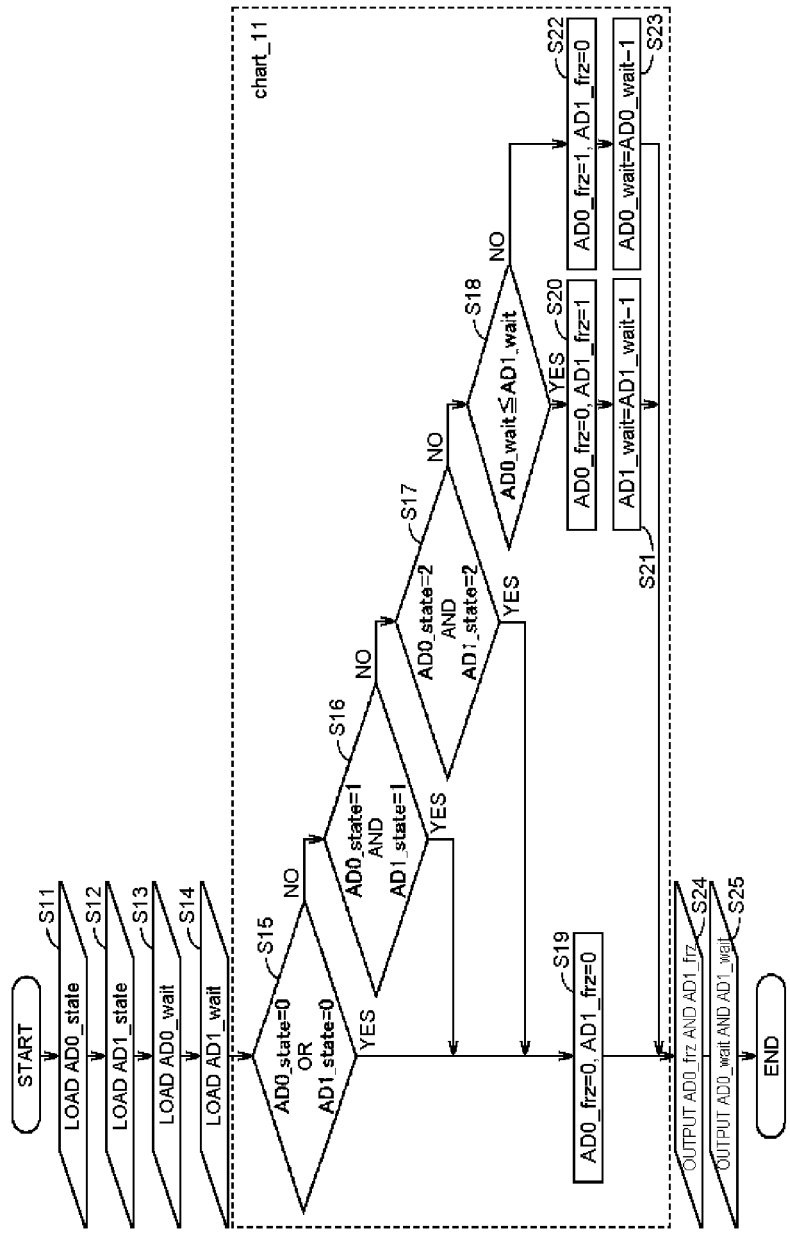
FIG. 15 is a flowchart showing a process for controlling interruption of comparison operation according to operation states of successive approximation register A/D converters.

FIG. 15 is a flowchart showing a process for controlling the interruption of the comparison operation in accordance with the operation states of the successive approximation register A/D converters.

In FIG. 15, the operation interruption signal outputted from the conversion operation controller 63 to the first successive approximation register A/D converter is represented by a signal AD0_frz and the operation interruption signal outputted from the conversion operation controller 63 to the second successive approximation register A/D converter is represented by a signal AD1_frz.

As shown in FIG. 15, the conversion operation controller takes in the signal AD_state for each successive approximation register A/D converter (S11 and S12).

The conversion operation controller 63 takes in the signal AD_wait for each successive approximation register A/D converter (S13 and S14).

Note that, the flowchart shown in FIG. 15 is a flowchart corresponding to one state (one comparison) in the comparison period of the successive approximation register A/D converter, and the signal AD_wait is given an initial value when the A/D conversion is started. The initial value is the number of states assigned to the reserve period.

When the signal ADC_frz is 0 in FIG. 14, that is, when each successive approximation register A/D converter is not required to interrupt the comparison operation by the interference, the conversion operation controller 63 turns off the operation interruption signal so as not to interrupt each successive approximation register A/D converter (turns off both the signal AD0_frz and the signal AD1_frz) (S15, S16, S17, and S19).

When the signal ADC_frz is 1 in FIG. 14, that is, when one of the successive approximation register A/D converters is affected by the interference, the conversion operation controller 63 compares the remaining number of times of the reserve period of each successive approximation register A/D converter (S18).

The conversion operation controller 63 generates the operation interruption signal to interrupt the comparison operation of a successive approximation register A/D converter having a larger remaining number of times in step S18 (S18, S20, and S22). The conversion operation controller 63 decrements the signal AD_wait indicating the remaining number of times of the successive approximation register A/D converter whose comparison operation is interrupted (S21 and S23).

The conversion operation controller 63 outputs the generated operation interruption signal to each successive approximation register A/D converter (S24).

Here, a specific example will be described in which a state is determined to be "a state where the operating current largely affects the other IP cores" and "a state where the operation is easily affected by the interference" in the operation state of the successive approximation register A/D converter.

In FIG. 15, the processes of steps S15, S16, S17, S18, S19, S20, S21, S22, and S23 are defined as a process chart_11.

FIGS. 16A, 16B, and 16C are diagrams showing states in which the influence of the operating current is large and states in which the operation is easily affected by the interference in the operation state of the successive approximation register A/D converter.

As shown in FIG. 16A, in the operation of the successive approximation register A/D converter, states in which the operation is easily affected by the interference are, for example, the end of the sampling period and the comparison period.

As shown in FIG. 16B, in the operation of the successive approximation register A/D converter, states in which the influence to the other IP cores is large may be a part of the sampling period and states where the period switches from the sampling period to the comparison period.

FIG. 16C shows the signal AD_state in each state. According to the configuration of the third embodiment, it is possible to reduce the influence of the interference even when the successive approximation register A/D converter affects other IP cores (for example, the other successive approximation register A/D converter).

Furthermore, when a plurality of successive approximation register A/D converters interferes with each other, it is possible to determine which successive approximation register A/D converter should be interrupted in accordance with the number of interruption times of the comparison operation in each successive approximation register A/D converter or in accordance with the remaining number of times of the reserve period in each successive approximation register A/D converter.

<4 Fourth Embodiment>

Next, a successive approximation register A/D converter and an integrated circuit according to another embodiment will be described.

<4.1 Configuration of Fourth Embodiment>

Figure 17:
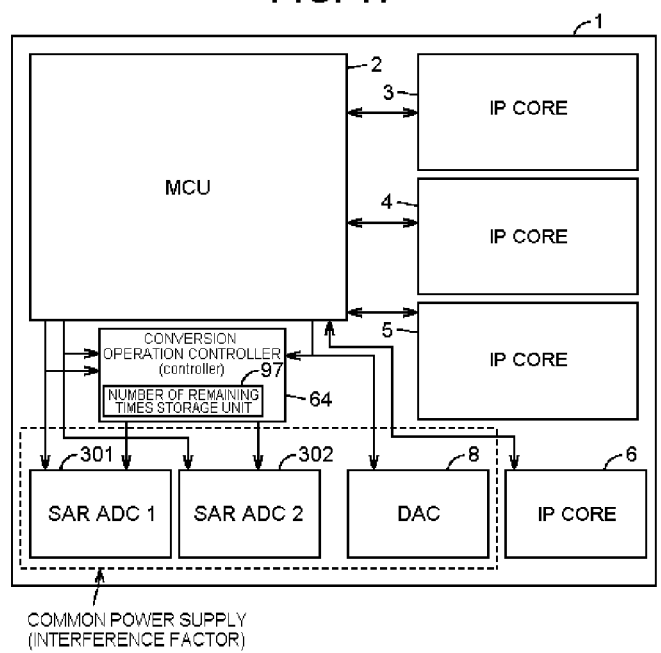
FIG. 17 is a diagram showing a configuration of an integrated circuit according to a fourth embodiment.

FIG. 17 is a diagram showing a configuration of an integrated circuit according to a fourth embodiment.

The fourth embodiment has a configuration in which there is a plurality of successive approximation register A/D converters as in the third embodiment and there is a DAC as in the first and the second embodiments. As shown in FIG. 17, two successive approximation register A/D converters and one DAC share a common power supply.

The conversion operation controller 64 acquires operation control signals to the successive approximation register A/D converters (successive approximation register A/D converter 301 and successive approximation register A/D converter 302) and the DAC 8. When the DAC 8 does not operate, the conversion operation controller 64 performs the same operation as that of the third embodiment. When the DAC 8 operates, the conversion operation controller 64 controls the output of the operation interruption signal depending on whether or not the state is a state in which each successive approximation register A/D converter is easily interfered.

As described in the second embodiment, the conversion operation controller 64 generates the signal DA_active indicating a timing when the DAC 8 affects each successive approximation register A/D converter.

Figure 18:
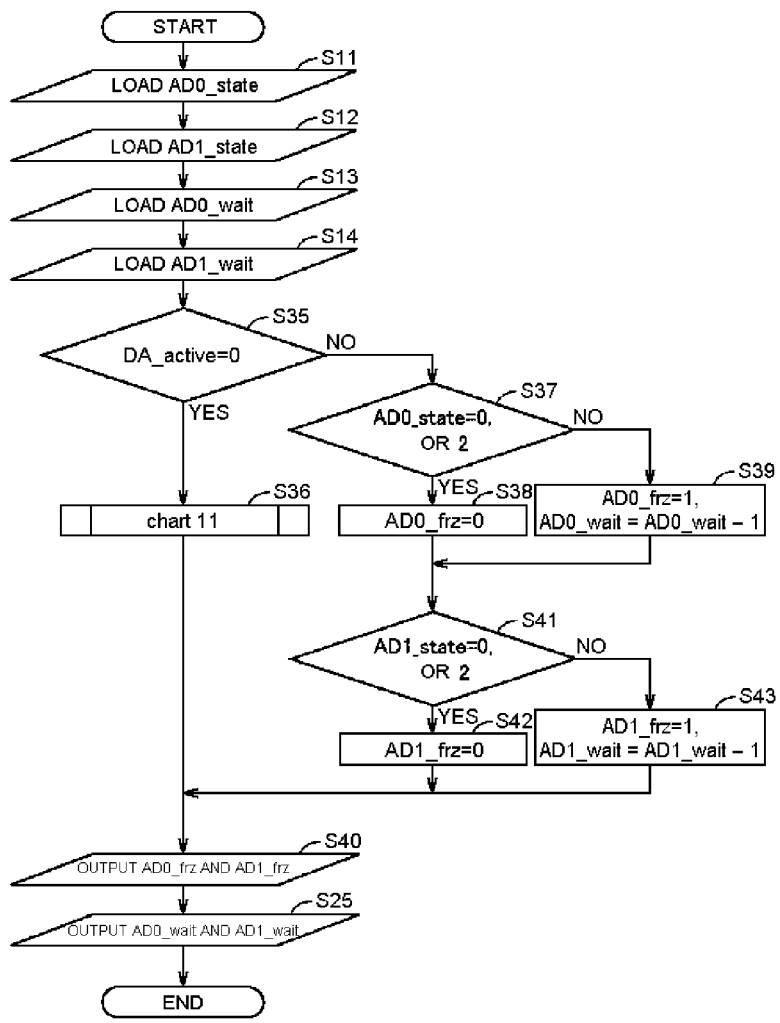
FIG. 18 is a flowchart showing a process for generating an operation interruption signal according to an operation state of a DAC 8.

FIG. 18 is a flowchart showing a process for generating the operation interruption signal according to the operation state of the DAC 8.

As described in the third embodiment, the conversion operation controller 64 takes in the signal AD_state (AD0_state and AD1_state) indicating the operation state of each successive approximation register A/D converter (S11 and S12).

The conversion operation controller 64 takes in the signal AD_wait (AD0_wait and AD1_wait) for each successive approximation register A/D converter (S13 and S14).

According to whether or not the timing is when the DAC affects the successive approximation register A/D converters, if the timing is when the DAC 8 does not affect the successive approximation register A/D converters (S35: YES), the conversion operation controller 64 performs the process chart_11 shown in FIG. 15 and generates the operation interruption signal for each successive approximation register A/D converter (S36).

If the timing is when the DAC 8 affects the successive approximation register A/D converters (S35: NO), when the first successive approximation register A/D converter is not affected by the interference (when the AD0_state is "0" or "2" shown in FIG. 13) (S37: YES), the conversion operation controller 64 turns off the operation interruption signal so as not to interrupt the comparison operation of the first successive approximation register A/D converter (S38).

When the operation state of the first successive approximation register A/D converter is affected by the interference in step S37 (S37: NO), the conversion operation controller 64 interrupts the comparison operation of the first successive approximation register A/D converter and decrements the signal AD0_wait indicating the remaining number of times of the reserve period (S39). If the timing is when the DAC 8 affects the successive approximation register A/D converters (S35: NO), when the second successive approximation register A/D converter is not affected by the interference (when the AD1_state is "0" or "2" shown in FIG. 13) (S40: YES), the conversion operation controller 64 turns off the operation interruption signal so as not to interrupt the comparison operation of the second successive approximation register A/D converter (S41).

When the operation state of the second successive approximation register A/D converter is affected by the interference in step S40 (S40: NO), the conversion operation controller 64 interrupts the comparison operation of the second successive approximation register A/D converter and decrements the signal AD1_wait indicating the remaining number of times of the reserve period (S42).

The conversion operation controller 64 outputs the operation interruption signal of each successive approximation register A/D converter according to the above steps S36, S37, S38, S39, S40, S41, and S42 (S24).

According to the configuration of the embodiment described above, it is possible to control the comparison operations of a plurality of successive approximation register A/D converters according to whether or not the DAC 8 operates. When the DAC 8 does not operate, the same effect as that of the third embodiment can be obtained and when the DAC 8 operates, the same effect as that of the second embodiment can be obtained.

<5 Fifth Embodiment>

Next, a successive approximation register A/D converter and an integrated circuit according to another embodiment will be described.

<5.1 Configuration of Fifth Embodiment>

Figure 19:
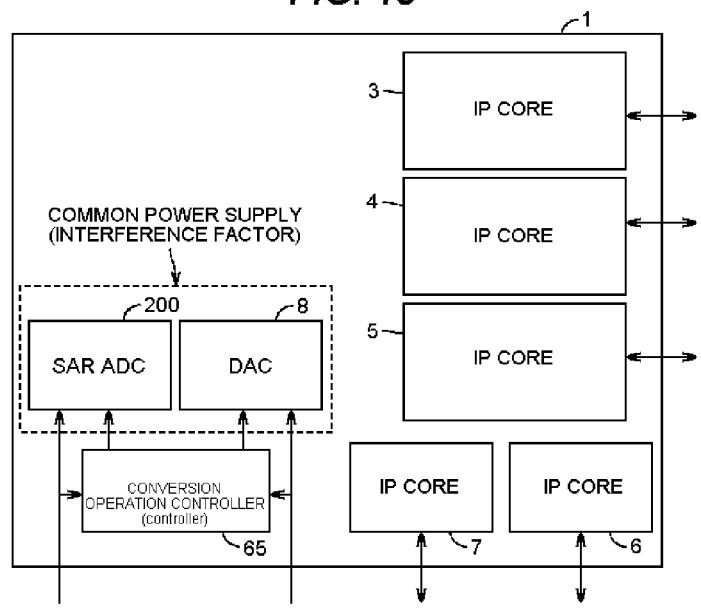
FIG. 19 is a diagram showing a configuration of an integrated circuit according to a fifth embodiment.

FIG. 19 is a diagram showing a configuration of an integrated circuit according to a fifth embodiment.

In the descriptions of the first to the fourth embodiments, it is assumed that the successive approximation register A/D converter and the control circuit (MCU 2) that outputs the operation control signal to the DAC 8 are located inside the integrated circuit 1.

Not only in this case, but also when the integrated circuit does not include the MCU 2 but includes IP cores and the control signals of the successive approximation register A/D converter and the DAC 8 are inputted from outside, a conversion operation controller 65 takes in the operation control signals, and thus it is possible to obtain the same effect as that of the first embodiment and the like.

<6 Sixth Embodiment>

Next, a successive approximation register A/D converter and an integrated circuit according to another embodiment will be described.

In the sixth embodiment, the successive approximation register A/D converter described in the first to the fifth embodiment is replaced by a redundant binary successive approximation register A/D converter.

In the redundant binary successive approximation register A/D converter, a correction is performed in the latter half of the comparison period. Therefore, the states of the first half of the comparison period may be difficult to be affected by the interference.

Figure 20:
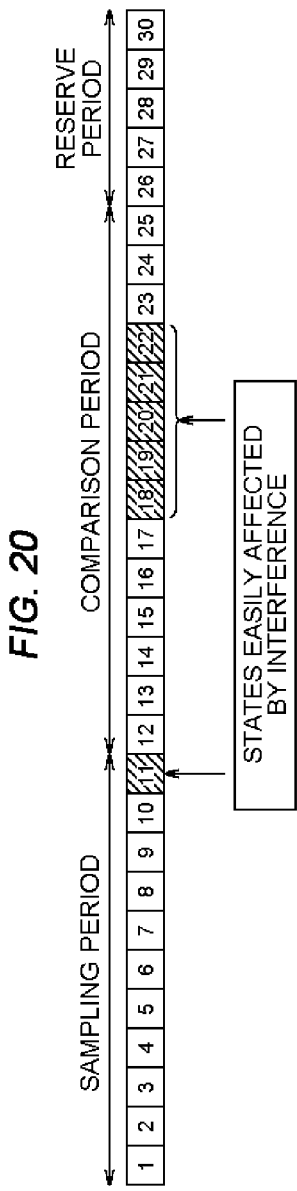
FIG. 20 is a diagram showing states which are easily affected by interference when a redundant binary successive approximation register A/D converter is used.

FIG. 20 is a diagram showing states which are easily affected by the interference when the redundant binary successive approximation register A/D converter is used.

In the case of a redundant binary successive approximation register A/D converter which performs N-bit conversion, the number of comparison times is greater than N. In the example shown in FIG. 20, the degree of conversion accuracy is 10 bits and the comparison is performed 14 times. Even if a certain amount of error occurs in the comparison in the first half of the comparison period (from state 12 to state 17 in the example of FIG. 20), the error is corrected in the comparison in the latter half of the comparison period. Therefore, it is assumed that there is no influence of the interference in these states.

Note that, in the same manner as in the second embodiment, the period in which there is no influence of the interference may be stored in a register or the like and be variable.

According to the configuration of the sixth embodiment, the states that are affected by the interference can be further limited.

<7 Seventh Embodiment>

Next, a successive approximation register A/D converter and an integrated circuit according to another embodiment will be described.

Even when the IP cores are not in synchronization with each other in the configurations of the first to the sixth embodiments described above, it is possible to reduce the influence of the interference and to prevent delay of the output of the A/D conversion.

Figure 21:
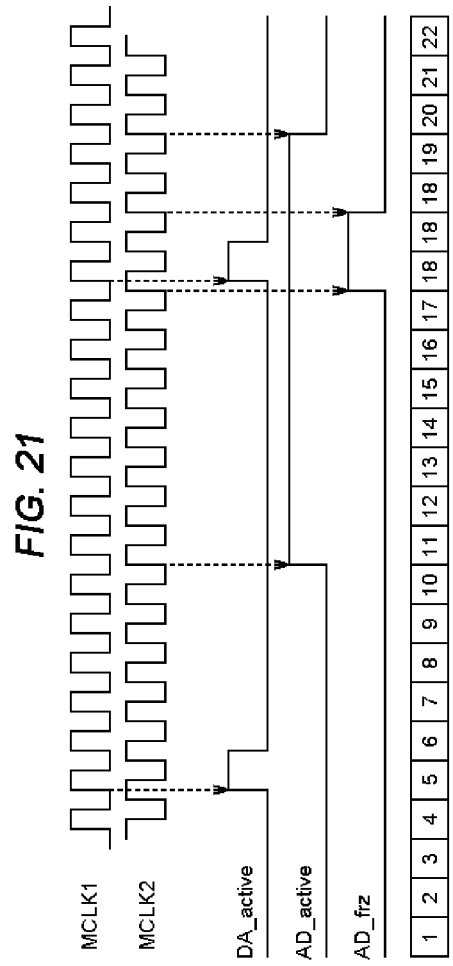
FIG. 21 is a timing chart when IP cores are not in synchronization with each other.

FIG. 21 is a timing chart when the IP cores are not in synchronization with each other. In FIG. 21, the configuration is the same as that of the second embodiment. The DAC 8 is in synchronization with the clock MCLK1 and the successive approximation register A/D converter 200 is in synchronization with the clock MCLK2.

In this case, the signal DA_active and the signal AD_active are generated on the basis of the operation control signals of the corresponding DAC 8 and the successive approximation register A/D converter 200, and thus the signal DA_active is in synchronization with the clock MCLK1. The signal AD_active is in synchronization with the clock MCLK2.

In FIG. 21, in the state 18, the signal DA_active rises late. In this case, the conversion operation controller 62 in the configuration of the second embodiment may generate the signal AD_frz to be generated by estimating the signal AD_frz from the signal DA_active and the signal AD_active of a predetermined states ahead (for example, two states ahead). For example, the conversion operation controller 62 estimates that the signal DA_active rises in the period of state 18 by the operation control signal.

The embodiments disclosed here should be considered as examples at all points and not limited. The scope of the present invention is defined by the claims rather than the foregoing description and it is intended that all changes are included in the scope and equivalent meanings of the claims.

What is claimed is:

1. An integrated circuit including a successive approximation register A/D (analog/digital) converter which obtains a comparison result of N bits (N is a number greater than or equal to 1), the integrated circuit comprising:
   a conversion operation controller that determines an interruption timing of a comparison operation in the successive approximation register A/D converter on the basis of an operation timing of a predetermined circuit that interferes with an operation of the successive approximation register A/D converter,
   wherein the successive approximation register A/D converter obtains the comparison result of N bits by a sampling period in which an analog signal is sampled, a comparison period of N states in which the sampled signal is sequentially compared with a comparison voltage for each bit, and a reserve period of M states (M is a number greater than or equal to 1) which follows the comparison period and in which a comparison of M bits can be performed, and
   an operation is interrupted in accordance with the determined interruption timing and a comparison operation of a bit where the comparison is not performed enough in the comparison period due to the interruption is performed in the reserve period.

2. The integrated circuit according to claim 1,
wherein the conversion operation controller includes
an acquisition unit that acquires an operation control signal outputted by a control circuit that controls operations of each circuit,
a generation unit that determines the interruption timing on the basis of the acquired operation control signal and that generates an operation interruption signal indicating a timing when an operation of the successive approximation register A/D converter is interrupted, and
an output unit that outputs the generated operation interruption signal to the successive approximation register A/D converter, and
the successive approximation register A/D converter interrupts the comparison operation in accordance with the operation interruption signal.

3. The integrated circuit according to claim 2,
wherein the control circuit from which the acquisition unit acquires an operation control signal is located outside the integrated circuit.

4. The integrated circuit according to claim 1,
wherein the successive approximation register A/D converter includes
a sample/hold circuit that samples an analog signal,
a built-in D/A (digital/analog) converter that outputs an analog signal of a comparison reference voltage corresponding to an inputted digital value,
a comparator that compares the sampled signal with the analog signal of the comparison reference voltage and that outputs a comparison result, and
a control unit that controls a digital value inputted into the built-in D/A converter in accordance with the comparison result of the comparator,
the control unit includes,
a holding unit that holds a count value indicating a position of a bit where a comparison is being performed,
a digital value generator that generates a next digital value indicating a magnitude of a comparison reference voltage in a comparison operation of the next bit in accordance with a position of a bit where a comparison is being performed, and
a digital value holder that holds a current digital value indicating a magnitude of a comparison reference voltage, which is outputted from the built-in D/A converter, in accordance with a position of a bit being compared with the sampling signal and the generated next digital value, and outputs either one of the current digital value and the next digital value to the built-in D/A converter, and
the comparison operation is interrupted by stopping update of the counter value of the holding unit at an interruption timing determined by the conversion operation controller and performing the outputting of the current digital value by the digital value holder.

5. The integrated circuit according to claim 1,
wherein the conversion operation controller
stores a timing when the comparison operation of the successive approximation register A/D converter is easily affected by interference and a timing when the comparison operation of the successive approximation register A/D converter is difficult to be affected by interference in association with each state in the comparison operation, and
makes the determination so that the timing when the comparison operation of the successive approximation register A/D converter is difficult to be affected by interference does not coincide with the interruption timing of the comparison operation.

6. The integrated circuit according to claim 5,
wherein the conversion operation controller includes
an acquisition unit that acquires an operation control signal outputted by a control circuit that controls operations of each circuit,
a generation unit that determines the interruption timing on the basis of the acquired operation control signal and that generates an operation interruption signal indicating a timing when an operation of the successive approximation register A/D converter is interrupted, and an output unit that outputs the generated operation interruption signal to the successive approximation register A/D converter, the generation unit generates the operation interruption signal in a state in which the stored timing when the comparison operation of the successive approximation register A/D converter is easily affected by interference and the operation timing of the predetermined circuit indicated by the operation control signal correspond to each other, and the successive approximation register A/D converter interrupts the comparison operation in accordance with the interruption timing indicated by the operation interruption signal.

7. The integrated circuit according to claim 5, wherein the successive approximation register A/D converter is a redundant binary successive approximation register A/D converter, and the conversion operation controller stores a predetermined number of states from the start of the comparison period of the successive approximation register A/D converter, as a timing that is difficult to be affected by interference, and stores states following the predetermined number of states, as a timing that is easily affected by interference.

8. The integrated circuit according to claim 1, wherein the conversion operation controller stores an operation timing when the successive approximation register A/D converter interferes with another circuit by the comparison operation of the successive approximation register A/D converter, in association with each state, and determines an interruption timing of the successive approximation register A/D converter on the basis of the operation timing when the successive approximation register A/D converter interferes with another circuit and an operation timing of the other circuit.

9. The integrated circuit according to claim 8, wherein the conversion operation controller stores a timing when the comparison operation of the successive approximation register A/D converter is easily affected by interference and a timing when the comparison operation of the successive approximation register A/D converter is difficult to be affected by interference, in association with each state in the comparison operation, and includes an acquisition unit that acquires an operation control signal outputted by a control circuit that controls operations of each circuit, a generation unit that determines the interruption timing on the basis of the acquired operation control signal and that generates an operation interruption signal indicating a timing when an operation of the successive approximation register A/D converter is interrupted, and an output unit that outputs the generated operation interruption signal to the successive approximation register A/D converter, the generation unit generates the operation interruption signal on the basis of the stored state in which the comparison operation of the successive approximation register A/D converter is easily affected by interference, a state in which the successive approximation register A/D converter interferes with another circuit, and the operation timing of the predetermined circuit indicated by the operation control signal, and the successive approximation register A/D converter interrupts the comparison operation in accordance with the operation interruption signal.

10. The integrated circuit according to claim 9, wherein another circuit the successive approximation register A/D converter interferes with is another successive approximation register A/D converter, each successive approximation register A/D converter performs the comparison operation by the sampling period, the comparison period, and the reserve period, and the generation unit of the conversion operation controller generates the operation interruption signal so as to interrupt any operation of the successive approximation register A/D converters on the basis of the numbers of interruption times of the operations of the successive approximation register A/D converters, in a state in which the successive approximation register A/D converters interfere with each other.

11. The integrated circuit according to claim 9, wherein the generation unit generates the operation interruption signal on the basis of the operation timing of the predetermined circuit in a state corresponding to the operation timing of the predetermined circuit indicated by the operation control signal, and generates the operation interruption signal on the basis of the stored state in which the comparison operation of the successive approximation register A/D converter is easily affected by interference and the state in which the successive approximation register A/D converter interferes with another circuit, in a state corresponding to the timing when the predetermined circuit does not operate.

12. The integrated circuit according to claim 1, wherein the successive approximation register A/D converter in the integrated circuit and the predetermined circuit are out of synchronization with each other.

* * * * *